United States Patent
Gao et al.

(10) Patent No.: US 7,221,566 B1
(45) Date of Patent: May 22, 2007

(54) SYSTEM FOR COOLING A PROCESSOR WHILE REDUCING AIR FLOW NOISE

(75) Inventors: Sili Gao, San Jose, CA (US); Walter H. Lowe, Reno, NV (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 10/767,462

(22) Filed: Jan. 28, 2004

(51) Int. Cl.
*H05K 7/20* (2006.01)

(52) U.S. Cl. .................. 361/695; 361/697; 257/721; 257/722; 174/16.3; 165/80.3

(58) Field of Classification Search .............. 361/687, 361/690–697, 703, 704; 257/722, 714, 715, 257/721; 174/16.1, 16.3, 15.2; 165/80.3, 165/104.33, 122, 185
See application file for complete search history.

(56) References Cited

U.S. PATENT DOCUMENTS

| | | | | |
|---|---|---|---|---|
| 5,582,506 A * | 12/1996 | Hong | ...................... | 415/177 |
| 5,838,066 A * | 11/1998 | Kitajo | ...................... | 257/722 |
| 6,084,775 A * | 7/2000 | Bartley et al. | ............... | 361/705 |
| 6,311,767 B1 * | 11/2001 | Inoue et al. | ............... | 165/80.4 |
| 6,643,129 B2 * | 11/2003 | Fujiwara | ...................... | 361/687 |
| 6,671,177 B1 * | 12/2003 | Han | ........................... | 361/719 |
| 6,681,845 B1 * | 1/2004 | Yeh et al. | ...................... | 165/122 |
| 6,697,256 B1 * | 2/2004 | Horng et al. | ............... | 361/704 |
| 6,711,016 B2 * | 3/2004 | Chung et al. | ............... | 361/695 |
| 6,717,814 B2 * | 4/2004 | Li | ............................. | 361/704 |
| 6,751,097 B1 * | 6/2004 | Lin et al. | ..................... | 361/695 |
| 6,765,794 B1 * | 7/2004 | Inoue | ........................ | 361/695 |
| 6,778,390 B2 * | 8/2004 | Michael | ...................... | 361/695 |
| 6,778,391 B2 * | 8/2004 | Inoue | ........................ | 361/695 |
| 6,819,564 B2 * | 11/2004 | Chung et al. | ............... | 361/697 |
| 2002/0079086 A1 * | 6/2002 | Huang et al. | ............... | 165/80.3 |
| 2002/0172008 A1 * | 11/2002 | Michael | ...................... | 361/697 |
| 2002/0185259 A1 * | 12/2002 | Park | .......................... | 165/80.3 |
| 2003/0030980 A1 * | 2/2003 | Bird et al. | ..................... | 361/694 |
| 2004/0136163 A1 * | 7/2004 | Horng et al. | ............... | 361/719 |
| 2004/0163795 A1 * | 8/2004 | Lin | ............................ | 165/80.3 |

* cited by examiner

*Primary Examiner*—Boris Chervinsky
(74) *Attorney, Agent, or Firm*—Patterson & Sheridan, L.L.P.

(57) ABSTRACT

A system is described for cooling a processor. In one embodiment, a heat sink assembly has a fan and air channels. In addition, a heat sink lid that is configured to cover only a region above the fan is coupled to the heat sink assembly.

12 Claims, 3 Drawing Sheets

SYSTEM FOR COOLING A PROCESSOR WHILE REDUCING AIR FLOW NOISE

BACKGROUND OF THE INVENTION

1. Field of the Invention

This invention relates generally to computer hardware and more particularly to a system for cooling a processor while reducing vibration.

2. Description of the Background Art

FIG. 1 is a side view illustrating a prior art system 100 used to cool a processor 112. As shown, system 100 typically includes a heat sink assembly 104, which further includes a fan 106, walls 109 (illustrated in FIG. 2), fins 115 (illustrated in FIG. 2), bottom surface 111 and a thermal adhesive 110, which is configured to thermally couple heat sink assembly 104 to processor 112. Thermal adhesive 110 has thermal properties that facilitate transferring heat generated by processor 112 to the bottom surface 111 of heat sink assembly 104. As also shown in FIG. 1, system 100 may include a heat sink lid 102, which, among other things, prevents particles and other contaminants from entering fan 106 and air blown from fan 106 from escaping the system 100, as described herein. The heat sink lid 102, together with the walls 109, fins 115, and bottom surface 111 of the heat sink assembly 104, define a plurality of air channels 108.

Fan 106 is configured to force air through air channels 108 such that the heat generated by processor 112 transfers to the air as the air passes over bottom surface 111. The heated air then exits heat sink assembly 104, as depicted by flow lines 114, thereby dissipating the heat generated by processor 112 into the external environment. The heat sink lid 102 prevents air from escaping air channels 108 in a direction normal to flow depicted by flow lines 114. This process cools processor 112 and, among other things, prevents processor 112 from burning up during operation.

As shown, heat sink lid 102 is configured with a fan hole 101 and air holes 103 that enable air from the external environment to enter heat sink assembly 104 to cool processor 112 as previously described. In other configurations, heat sink lid 102 may include air slots (not shown) that may trace the shapes of air channels 108. These air slots may be in addition to or in lieu of air holes 103. In prior art systems 100, heat sink lid 102 oftentimes comprises a solid metal piece, made from a metal such as aluminum FIG. 2 is an isometric view illustrating heat sink assembly 104 of FIG. 1. This view provides a better perspective of fan 106, fins 115, walls 109 and air channels 108. Persons skilled in the art will understand that air channels 108 typically are configured to direct air blown from fan 106, over bottom surface 111, to the external environment in a manner that most efficiently removes heat from processor 112 (not shown).

FIG. 3 is a side view illustrating a standing wave pattern 300 forming in a portion of one of air channels 108 of FIG. 1. One drawback of using system 100, including heat sink lid 102 comprised of a solid metal, to cool processor 112 is that the sound wave produced when fan 106 forces air through air channel 108 oftentimes establishes a standing wave, similar to standing wave pattern 300, within air channel 108. As persons skilled in the art will understand, this phenomenon substantially increases the noise level of the air flow through air channel 108 because the resulting standing wave produced by the interference between incident sound wave 301a and reflected sound wave 301b has an amplitude at the antinodes that is substantially greater than the amplitude of incident sound wave 301a. The increased noise is particularly annoying to persons who use computers and other electronic devices that include a system similar to system 100.

Thus, there is a need in the art for a system for cooling a processor while reducing air flow noise.

SUMMARY OF THE INVENTION

One embodiment of a system for cooling a processor includes a heat sink assembly that has a fan and air channels. The system also includes a heat sink lid that is coupled to the heat sink assembly and is configured to cover only a region above the fan.

One advantage of the disclosed system is that, among other things, the system produces less air flow noise during operation.

DETAILED DESCRIPTION OF THE INVENTION

Figure 1:
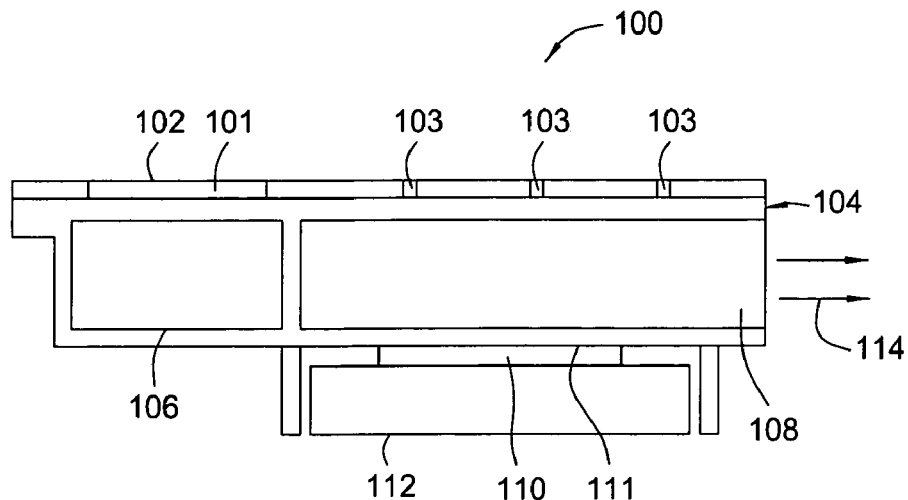
FIG. 1 is a side view illustrating a prior art system used to cool a processor.
Figure 2:
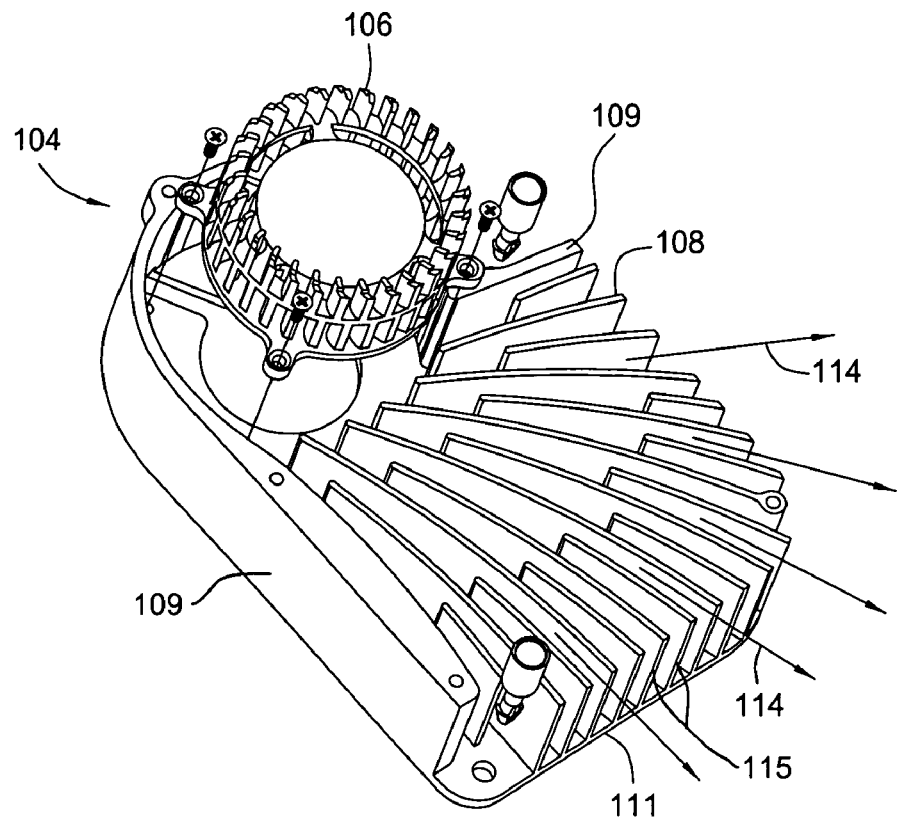
FIG. 2 is an isometric view illustrating the heat sink assembly of FIG. 1.
Figure 3:
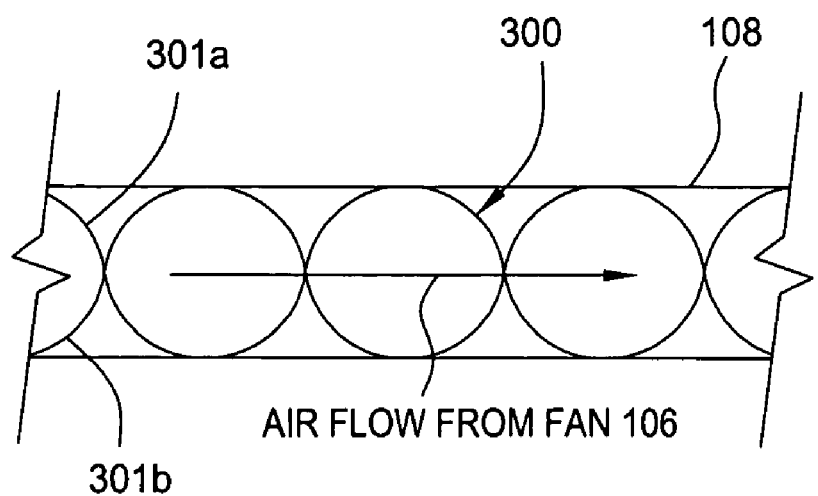
FIG. 3 is a side view illustrating a standing wave pattern forming in a portion of one of the air channels of FIG. 1.
Figure 4:
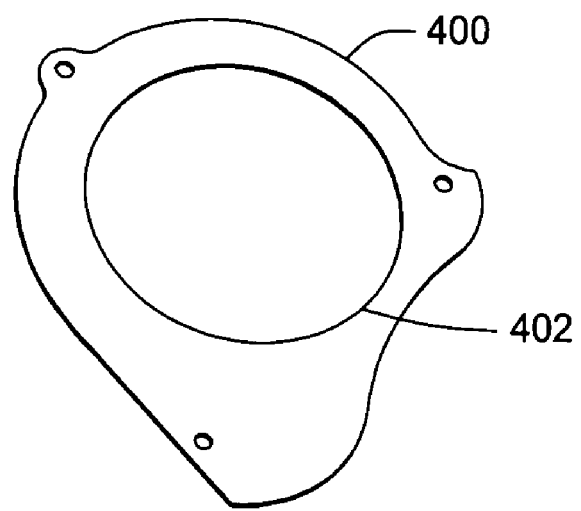
FIG. 4 is a top view illustrating an improved heat sink lid, according to one embodiment of the invention.

FIG. 4 is a top view illustrating an improved heat sink lid 400, according to one embodiment of the invention. Heat sink lid 400 is configured to be coupled to heat sink assembly 104 of prior art system 100 in lieu of heat sink lid 102. As shown, heat sink lid 400 is configured to cover heat sink assembly 104 only in the vicinity of where fan 106 is disposed and includes a fan hole 402. The general shape and dimensions of heat sink lid 400, and whether heat sink lid 400 includes fan hole 402 or air holes 103 (see FIG. 1) or some other type of air passageway into either fan 106 or air channels 108, in no way limits the scope of the invention. The heat sink lid 400 may be manufactured from any material and may have stiffness properties of any kind as long as heat sink lid 400 functions as intended.

Figure 5:
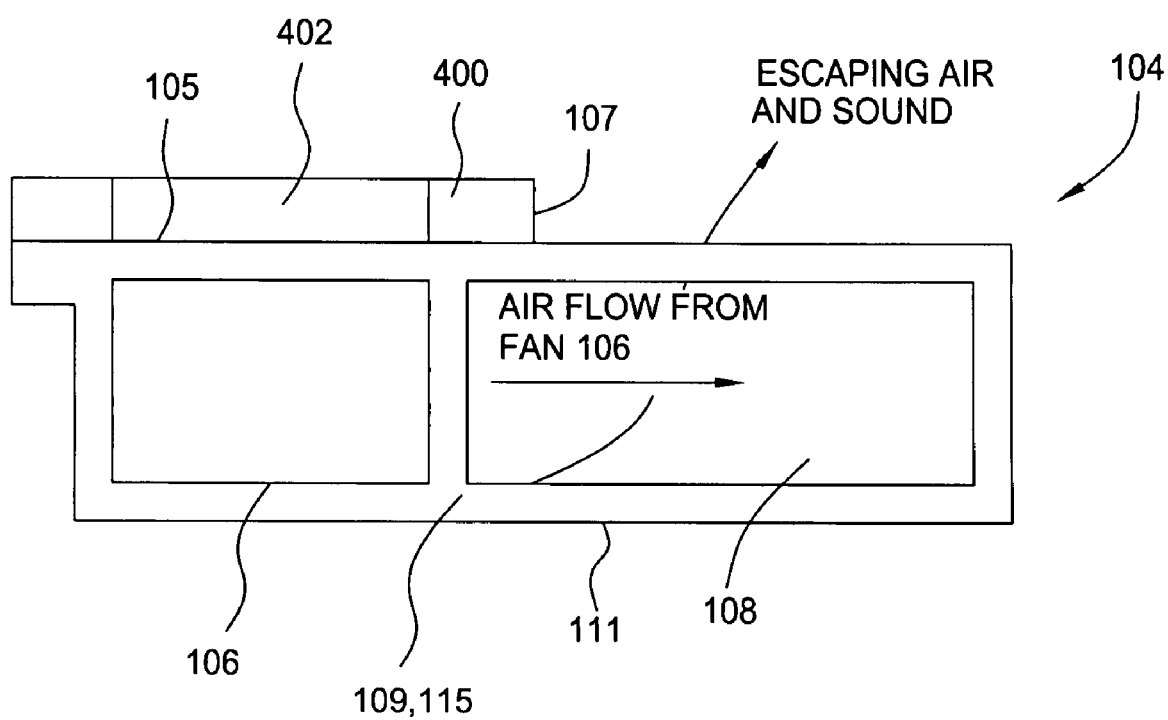
FIG. 5 is a side view illustrating a sound wave exiting from the heat sink assembly with the improved heat sink lid of FIG. 4, according to one embodiment of the invention.

FIG. 5 is a cross-sectional view illustrating a sound wave exiting from the heat sink assembly 104 with improved heat sink lid 400 of FIG. 4, according to one embodiment of the invention. As illustrated, the heat sink lid 400 is configured to cover the region 105 above the fan 106, but leaves a portion of air channels 108 uncovered. As those skilled in the art will appreciate, the heat sink lid 400 covers a cavity around the fan 106, thereby generating the necessary pressure to force air deflected by the blades of the fan 106 through the air channels 108.

As further illustrated in FIG. 5, the uncovered portion of air channels 108, defined by walls 109 fins 115, and the bottom surface 111 of the heat sink assembly 104, replaces the solid surface of a conventional heat sink lid, such as metal heat sink lid 102, that reflects sound waves propagating through the air channels 108. Thus, incorporating the heat sink lid 400 eliminates the reflective surface, thereby preventing a standing wave, such as standing wave pattern 300, from forming in air channels 108 during operation. For this reason, a system incorporating the heat sink lid 400, as opposed to prior art heat sink lid 102, produces less air flow noise during operation.

In one embodiment of the invention, illustrated in FIG. 5, the heat sink lid 400 is configured such that an edge 107 is positioned substantially perpendicular to the direction of air flow within the air channel 108. A person skilled in the art will understand that such a configuration prevents turbulent flow from developing when air escaping from air channel 108 flows across edge 107. The prevention of turbulence further reduces air flow noise generated by the system 100 during operation.

Persons skilled in the art will recognize that system 100, including heat sink lid 400, may be used to cool any type of processor 112. For example, in one embodiment, processor 112 comprises a graphics processing unit. In an alternative embodiment, processor 112 may comprise a central processing unit. In yet another alternative embodiment, processor 112 may comprise an application-specific integrated circuit (ASIC).

Thus, the present invention represents a significant advancement in the field of processor cooling. By preventing the formation of a standing wave, a system used to cool a processor that incorporates the improved heat sink lid described herein will produce less air flow noise in operation than systems that incorporate conventional heat sink lids.

Although the invention has been described above with reference to specific embodiments, persons skilled in the art will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A system for cooling a processor, the system comprising:
    the processor;
    a heat sink assembly having a fan, a plurality of fins, and a bottom surface, wherein the plurality of fins and at least a portion of the bottom surface define air channels, and the heat sink assembly is disposed onto the processor; and
    a heat sink lid coupled to the heat sink assembly, wherein:
        the heat sink lid only covers a portion of the air channels proximate the fan,
        the heat sink assembly is configured such that air flows directly from the fan along the bottom surface of the heat sink assembly, and
        the length of at least one fin of the plurality of fins is equal to or greater than the length of the processor.

2. The system of claim 1, further comprising a thermal adhesive disposed on an outer surface of the heat sink assembly for thermally coupling the heat sink assembly to the processor.

3. The system of claim 1, wherein the uncovered portion of the air channel reduces air flow noise in the system during operation.

4. The system of claim 3, wherein the uncovered portion of the air channel reduces air flow noise by preventing the formation of a standing wave within the air channel during operation.

5. The system of claim 4, wherein the uncovered portion of the air channel prevents the formation of the standing wave by preventing the reflection of an incident wave propagating within the air channel during operation.

6. The system of claim 1, wherein the heat sink lid includes an edge configured to reduce turbulent flow of air escaping from the air channel and flowing across the edge.

7. The system of claim 6, wherein the edge is substantially perpendicular to a direction of air flow within the air channel.

8. The system of claim 1, wherein the processor comprises a graphics processing unit.

9. The system of claim 1, wherein the processor comprises a central processing unit.

10. The system of claim 1, wherein the processor comprises an application-specific integrated circuit.

11. The system of claim 1, wherein the heat sink assembly further has a wall and the heat sink lid is directly coupled to the wall.

12. The system of claim 1, wherein the bottom surface is substantially flat.

* * * * *